United States Patent
Pereira et al.

(10) Patent No.: US 12,141,453 B2
(45) Date of Patent: Nov. 12, 2024

(54) METHOD, MEMORY CONTROLLER AND METHOD DEVICE THAT ORGANIZES DATA DURING REFRESH CYCLES

(71) Applicant: SAMSUNG ELECTRONICS CO., LTD., Suwon-si (KR)

(72) Inventors: Rowen Alphonso Pereira, Karnataka (IN); Chandrashekhar Mallikarjuna Joshi, Karnataka (IN); Saugata Das Purkayastha, Karnataka (IN)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/130,000

(22) Filed: Apr. 3, 2023

(65) Prior Publication Data

US 2024/0272817 A1 Aug. 15, 2024

(30) Foreign Application Priority Data

Feb. 10, 2023 (IN) .............................. 202341008836

(51) Int. Cl.
*G06F 12/02* (2006.01)
*G06F 3/06* (2006.01)

(52) U.S. Cl.
CPC .......... *G06F 3/0632* (2013.01); *G06F 3/0604* (2013.01); *G06F 3/064* (2013.01); *G06F 3/0679* (2013.01)

(58) Field of Classification Search
CPC ............ G11C 11/5642; G11C 16/3427; G11C 16/3431; G11C 16/26; G11C 16/3422
See application file for complete search history.

(56) References Cited

U.S. PATENT DOCUMENTS

| | | | |
|---|---|---|---|
| 10,014,060 B2 | 7/2018 | Tuers et al. | |
| 10,770,156 B2 | 9/2020 | Padilla et al. | |
| 2016/0163393 A1 | 6/2016 | Liang et al. | |
| 2018/0374548 A1 | 12/2018 | Achtenberg et al. | |

OTHER PUBLICATIONS

Yixin Luo et al., "WARM: Improving NAND Flash Memory Lifetime with Write-hotness Aware Retention Management" 2015 IEEE.
Extended European Search Report in European Appln. No. 23197094.8, mailed on Apr. 24, 2024, 11 pages.

*Primary Examiner* — Yong J Choe
(74) *Attorney, Agent, or Firm* — Fish & Richardson P.C.

(57) ABSTRACT

In a method of organizing data during refresh cycles of a memory device, a read request is sent to a non-volatile flash memory including a plurality of source blocks and a plurality of destination blocks. Data of the plurality of source blocks are read upon sending the read request. The frequency of bit error rate (BER) for the data stored in the plurality of source blocks is identified. The data within the plurality of source blocks are grouped and segregated based on the frequency of BER and a threshold value. The plurality of source blocks and the plurality of destination blocks are refreshed by moving the data present in the plurality of source blocks to respective destination blocks based on the segregated data and moving data from the respective destination blocks to other respective destination blocks.

20 Claims, 5 Drawing Sheets

METHOD, MEMORY CONTROLLER AND METHOD DEVICE THAT ORGANIZES DATA DURING REFRESH CYCLES

CROSS-REFERENCE TO RELATED APPLICATIONS

A claim of priority under 35 U.S.C. § 119 is made to Indian Patent Application No. 202341008836, filed on Feb. 10, 2023 in the Indian Intellectual Property Office, the entirety of which is hereby incorporated by reference.

BACKGROUND

The present disclosure relates to memory devices, and more particularly to memory controllers and methods of organizing data in memory devices during refresh cycles of the memory devices.

Semiconductor memory devices for storing data may be classified into volatile memory devices and non-volatile memory devices. Volatile memory devices such as dynamic random access memory (DRAM) devices for example, may be configured to store data by charging or discharging capacitors in memory cells, and thus lose the stored data when powered off. Non-volatile memory devices such as flash memory devices for example maintain stored data even when powered off. Volatile memory devices are widely used as main memories of various apparatuses, and non-volatile memory devices are widely used for storing program code and/or data in various electronic devices, such as computers, mobile devices, etc.

In non-volatile memory devices, cell charge stored in a memory cell may be lost due to leakage current or charge distribution. In addition, when a wordline (WL) in a memory cell array is transitioned frequently between an active state and a precharged state (i.e., when the WL is accessed intensively or frequently), a memory cell connected to a WL that is adjacent to the frequently accessed WL may lose stored charge. Charge stored in a memory cell may be maintained by recharging the memory cell before data is lost due to leakage of cell charge. Such recharging of cell charge is referred to as a refresh operation, and may be performed repeatedly to prevent significant loss of cell charge.

During a refresh operation, the data in certain memory locations are moved to other memory locations. However, conventional techniques do not optimize the refresh operations, and data with different data retention ability (i.e., hotness) are typically mixed in each of corresponding blocks. As a result, redundant movement of cold data occurs.

SUMMARY

Embodiments of the inventive concepts provide a method of organizing data during a refresh cycle of a memory device. The method includes sending, by a memory controller, a refresh read request to a non-volatile flash memory including a plurality of source blocks and a plurality of destination blocks; reading, by the memory controller, data from the plurality of source blocks after sending the refresh read request; identifying, by the memory controller, a frequency of bit error rate for the data stored in the plurality of source blocks; segregating, by the memory controller, the data within the plurality of source blocks based on the frequency of bit error rate and a bit error rate threshold value; and refreshing, by the memory controller, the plurality of source blocks and the plurality of destination blocks by moving the data in the plurality of source blocks to respective destination blocks from among the plurality of destination blocks based on the segregating.

Embodiments of the inventive concepts further provide a memory controller that organizes data during a refresh cycle of a memory device. The memory controller includes a memory storing coding; and a processor. The processor responsive to the coding sends a refresh read request to a non-volatile flash memory including a plurality of source blocks and a plurality of destination blocks; reads data from the plurality of source blocks after sending the refresh read request; identifies a frequency of bit error rate for the data stored in the plurality of source blocks; segregates the data within the plurality of source blocks based on the frequency of bit error rate and a bit error rate threshold value; and refreshes the plurality of source blocks and the plurality of destination blocks by moving the data in the plurality of source blocks to respective destination blocks from among the plurality of destination blocks based on the data segregated within the plurality of source blocks.

Embodiments of the inventive concepts still further provide a memory device including a memory having a plurality of source blocks and a plurality of destination blocks, wherein each of the plurality of source blocks store a mix of data having a plurality of read frequencies that are different; and a memory controller that provides commands to the memory to access the data in the plurality of the source blocks and data in the plurality of destination blocks. Responsive to the commands provided from the memory controller during a first refresh cycle of a refresh operation, the memory moves data from among the data stored in the plurality of source blocks and having a first read frequency from among the plurality of read frequencies to a first destination block from among the plurality of destination blocks so that only the data having the first read frequency is stored in the first destination block, and moves data from among the data stored in the plurality of source blocks and having a second read frequency from among the plurality of read frequencies to a second destination block from among the plurality of destination blocks so that only the data having the second read frequency is stored in the second destination block.

BRIEF DESCRIPTION OF THE DRAWINGS

Embodiments of the inventive concepts will be more clearly understood from the following detailed description taken in conjunction with the accompanying drawings in which.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
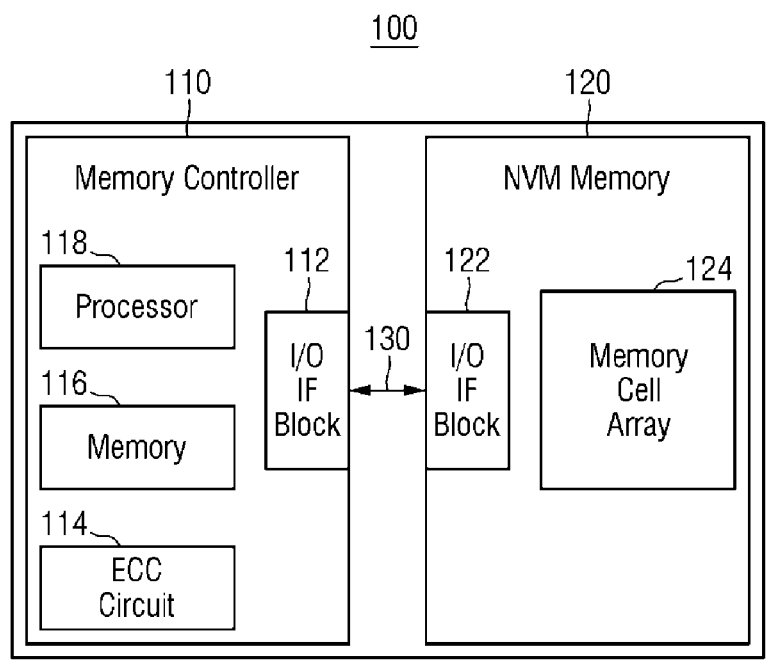
FIG. 1 illustrates a storage device that organizes data stored during a refresh operation according to embodiments of the inventive concepts.

FIG. 1 illustrates a memory device 100 that organizes stored data during a refresh operation, according to embodiments of the inventive concepts. Referring to FIG. 1, memory device 100 may include a memory controller 110 and non-volatile memory 120. Although conceptual hardware configurations included in the memory device 100 are hereinafter described, other embodiments may include other configurations. The memory controller 110 may control the non-volatile memory 120 so that data is written to the non-volatile memory 120 in response to a write request from a host (not shown), or so that data stored in the non-volatile memory 120 is read therefrom in response to a read request from the host.

In some embodiments, the memory device 100 may be internal memory embedded in an electronic device. For example, the memory device 100 may be an embedded universal flash storage (UFS) memory device, an embedded multi-media card (eMMC®), or solid state drive (SSD). However, the inventive concepts are not limited thereto, and in other embodiments the memory device 100 may for example include nonvolatile memory such as one time programmable read-only memory (OTPROM), programmable read-only memory (PROM), erasable and programmable read-only memory (EPROM)), electrically erasable and programmable read-only memory (EEPROM), mask read-only memory (ROM), or flash ROM, or the like. In some embodiments, the memory device 100 may include external memory attachable to and detachable from an electronic device. For example, the storage device 100 may include at least one of a UFS memory card, a Compact Flash® (CF) card, a Security Digital™ card (SD), microSD® card, a MiniSD® card, extreme digital (xD), and a Memory Stick™ (MS). In the description that follows, the non-volatile memory 120 may be characterized as NAND flash memory.

The memory device 100 and the host may be variously implemented as or included in an electronic device such as for example a personal computer (PC), a laptop, an ultra-mobile PC (UMPC), a workstation, a server, a net-book, a personal digital assistant (PDA), and a portable computer, a web tablet, a wireless phone, a mobile phone, a smart phone, a digital camera, a digital audio recorder, a digital audio player, a digital picture recorder, a digital picture player, a digital video recorder, a digital video player, a home network or another device, combination of devices or system capable of "communicating" (e.g., transmitting and/or receiving) information in hardwire and/or wireless environments.

The memory controller 110 may include an input/output (I/O) interface block 112, an error correction coding (ECC) circuit 114, a processor 118 and memory 116 among other peripheral circuits or blocks. An output signal from the memory controller 110 may be transmitted by the I/O interface block 112 to the non-volatile memory 120 via data bus line 130. An input signal from the non-volatile memory 120 may be received by the I/O interface block 112 via data bus line 130. For example, the output signal may be a refresh read request sent by the memory controller 110, and the input signal may be data transmitted by the non-volatile memory 120 responsive to a read request. The data bus line 130 may include a PCIe bus for example. The processor 118 may control overall operation of the memory controller 110, and may perform logical operations and communicate with the host through a host interface (not shown). The processor 118 may control the memory controller 110 to provide various read, write and refresh read commands to the non-volatile memory 120 to access data stored in the non-volatile memory 120 according to coding (e.g., instructions or programming) loaded from memory 116 (e.g., non-volatile read only memory) or according to coding loaded from the non-volatile memory 120.

The non-volatile memory 120 may include I/O IF block 122 and memory cell array 124 among other peripheral circuits or blocks. I/O IF block 122 may send signals to and receive signals from I/O IF block 112 of the memory controller 110 via data bus line 130. I/O IF block 122 may include interface logic (HIL). The non-volatile memory 120 may further include managers (not shown). The HIL and managers may be embodied by a circuit or circuitry.

Memory cell array 124 may include a plurality of memory blocks each having a plurality of memory cells. The memory blocks may have a two-dimensional structure in which memory cells are arrayed in a plane parallel to a substrate surface, or a three-dimensional structure in which memory cells are arrayed in three dimensions so as to be stacked over a substrate surface. The memory blocks may each include a plurality of pages respectively coupled to different wordlines.

The non-volatile memory 120 is responsive to command and control signals (not shown) received from the memory controller 110 via I/O IF block 112 and data bus line 130 or the other bus lines (not shown), and may execute operations such as program, read, and erase operations of the memory cell array 124. For example, during a program operation, peripheral circuits such as an address decoder of the non-volatile memory 120 (not shown) may provide a program voltage to a selected wordline among the wordlines of the memory cell array 124, and a data I/O circuit (not shown) may program data to memory cells of the memory cell array 124 connected to the selected wordline.

Upon reading data from the memory cell array 124 of the non-volatile memory 120, the memory controller 110 may segregate and refresh the read data based on identified frequency of bit error rate (BER) of the stored data. The frequency of bit error rate for the data may be identified by the ECC circuit 114 based on the corresponding read temperature of the data. The memory cell array 124 may include a plurality of source blocks and plurality of destination blocks. For example, a user may store data in the memory cell array 124, and the user may then read the data from the memory cell array 124 after it is stored.

However, data stored in the memory cell array 124 (e.g., non-volatile flash memory) may be error free for only a limited time or limited number of read or write operations. After the limited number of read or write operations, the charge stored in the memory cells of the memory cell array 124 may be subject to disturbance resulting in errors. To improve reliability of the stored data, the data is periodically moved from source blocks to destination blocks. This process is called a refresh operation, which may be performed as including a number of refresh cycles. The source blocks and the destination blocks are logical blocks and are mapped to physical memory locations using a logical to physical (L2P) mapping table that may be stored and maintained in the memory controller 110 for example. The memory controller 110 of the memory device 100 is configured to send a refresh read request to the non-volatile memory 120. The refresh read request may be sent periodically under control of the memory controller 110 or may be initiated by a user.

Figure 2:
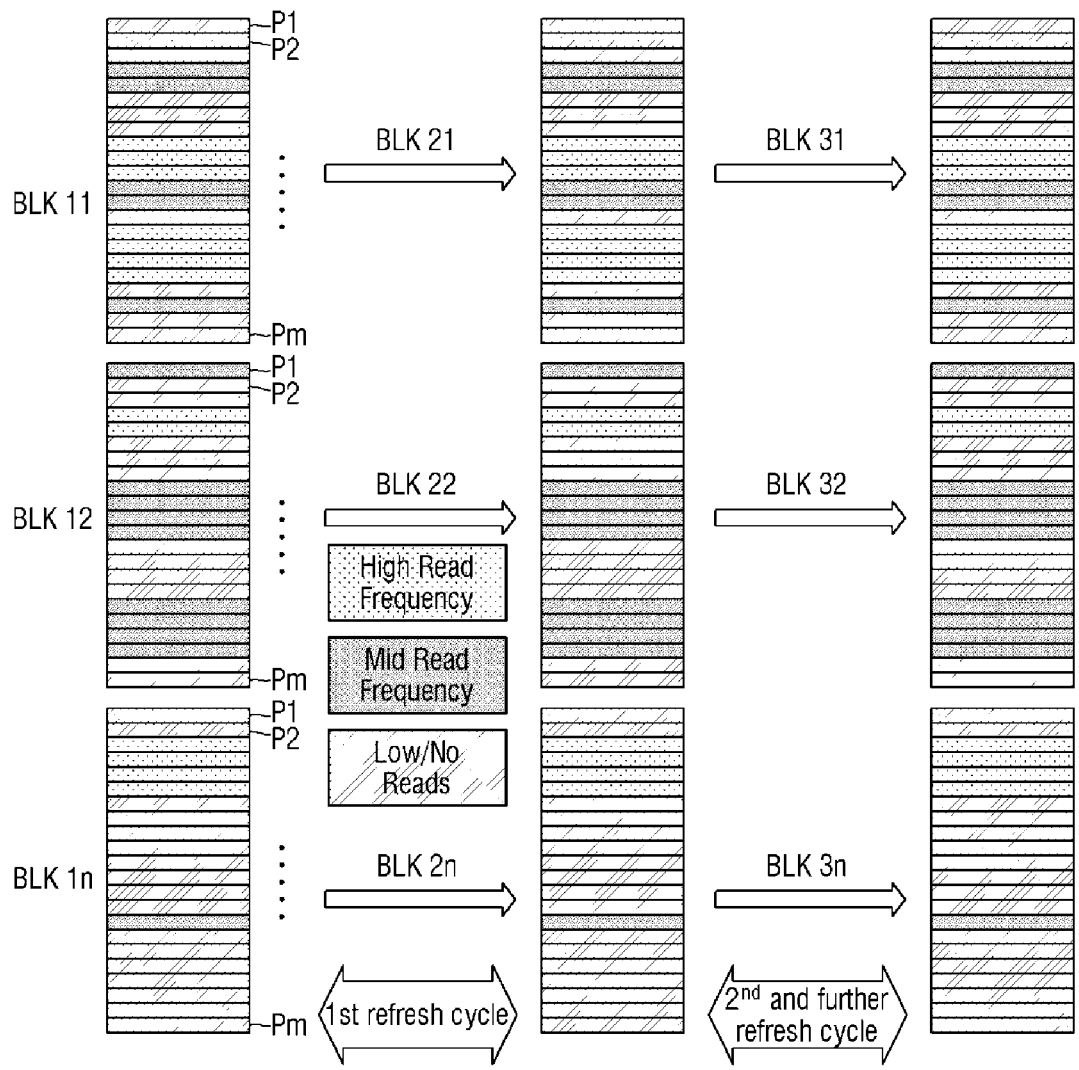
FIG. 2 illustrates a comparative example of a method of organizing data in a memory such as a non-volatile flash memory.

FIG. 2 illustrates a comparative example of a method of organizing data in a memory such as a non-volatile flash memory. In FIG. 2, the left column depicts source blocks BLK11, BLK12, . . . BLK1n each including pages P1, P2, . . . Pm, wherein the pages as indicated respectively contain one of hot data (i.e., high read frequency data), warm data (i.e., mid read frequency data) or cold data (low/no read frequency data). During the first refresh cycle responsive to a refresh read request, the data in the source blocks BLK11, BLK12, . . . BLK1n are respectively moved to first destination blocks BLK21, BLK22, . . . BLK2n, where the pages in the source blocks retain the same respective positions in the first destination blocks. During a following second refresh cycle, the data in the first destination blocks BLK21, BLK22, . . . BLK2n are respectively moved to second destination blocks BLK31, BLK32, . . . BLK3n, where the pages in the first destination blocks retain the same respective positions in the second destination blocks. As may be understood, the hot, warm and cold data are mixed in the corresponding source and destination blocks, and redundant movement of cold data occurs without segregation of hot, warm and cold data, and the refresh operation is not optimized. That is, each of the corresponding source and destination blocks store a mix of data having different read frequencies (e.g., high read frequency, mid read frequency, and low/no read frequency).

Figure 3:
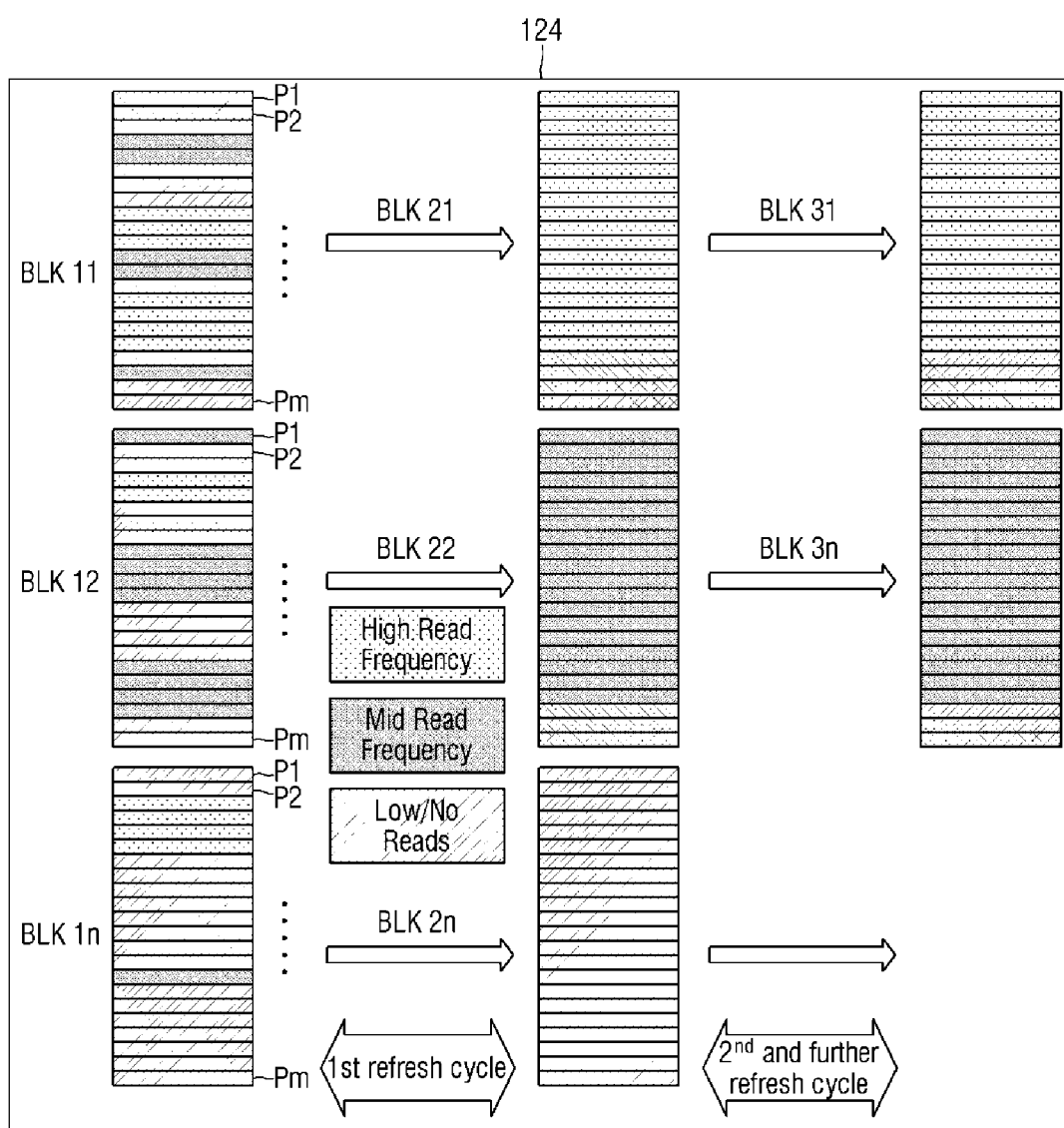
FIG. 3 illustrates a method of organizing data stored in a non-volatile memory 120 shown in FIG. 1, according to embodiments of the inventive concepts.

FIG. 3 illustrates a method of organizing data stored in a non-volatile memory 120 shown in FIG. 1, according to embodiments of the inventive concepts. In this embodiment, each of the source blocks store a mix of data having different read frequencies (e.g., high read frequency, mid read frequency, and low/no read frequency). As should be understood from FIG. 3, during the refresh cycles the hot data as mixed in the various source blocks with the warm and cold data are segregated and grouped together in corresponding destination blocks, the warm data as mixed in the various source blocks with the hot and cold data are segregated and grouped together in corresponding destination blocks, and the cold data as mixed in the various source blocks with the hot and warm data are segregated and grouped together in corresponding destination blocks. The detail of organizing is described hereinafter with reference to FIGS. 1 and 3.

Memory cell array 124 of non-volatile memory 120 may be logically divided into source blocks BLK11, BLK12, . . . BLK1n, first destination blocks BLK21, BLK22, . . . BLK2n, and second destination blocks BLK31, BLK32, . . . BLK3n, with each of the blocks including pages P1, P2, . . . Pm. The pages of the source and destination blocks as indicated respectively in FIG. 3 contain one of hot data (i.e., high read frequency data), warm data (i.e., mid read frequency data) or cold data (i.e., low/no read frequency data). The source blocks may hold data that is moved to destination blocks during refresh cycles. Although only two refresh cycles are shown in FIG. 3, in other embodiments various number of refresh cycles may be performed. Also, the source blocks and the destination blocks may include any number of pages and should not be limited. Moreover, although the data of the source blocks in FIG. 3 are characterized as one of hot, warm, or cold data, in other embodiments the data of the source blocks may be characterized into any number of groups based on read frequency and should not be limited.

In accordance with the method of organizing data during a refresh operation of the inventive concepts according to FIG. 3, memory controller 110 may read data from the plurality of source blocks BLK11, BLK12, . . . BLK1n of memory cell array 124 upon (e.g., after) sending the refresh read request to the non-volatile memory 120. Memory controller 110 may identify a frequency of bit error rate (BER) for the data stored in the pages of the plurality of source blocks BLK11, BLK12, . . . BLK1n. The BER may be determined by the ECC 114. Although the ECC circuit 114 is shown in FIG. 1 as disposed within and part of memory controller 110, in other embodiments the ECC circuit 114 may be disposed outside or separate from the memory controller 110. The memory controller 110 may segregate the pages of the plurality of source blocks BLK11, BLK12, . . . BLK1n based on the frequency of BER and a BER threshold value.

In some embodiments, when the refresh operation is initiated, the memory controller 110 may obtain the BER values of the pages of the source blocks BLK11, BLK12, . . . BLK1n from the ECC circuit 114. In some embodiments, the ECC circuit 114 may be connected to the non-volatile memory 120 via one or more channels (not shown). For example, there may be multiple memory chips in the non-volatile memory 120, and each memory chip may be associated with respective ECC circuits within the memory controller 110. The ECC circuit 114 may determine the BER of the pages in the source blocks BLK11, BLK12, . . . . BLK1n and may correct the error bits. In some embodiments, the BER threshold value may be predefined and stored in the memory controller 112 and/or the ECC circuit 114. In other embodiments the BER threshold value may be user selectable. In some embodiments, the BER is measured during garbage collection (GC) read operations, although the read operations may be performed during other operations of the storage device 100.

The memory controller 110 refreshes the plurality of source blocks BLK11, BLK12, . . . BLK1n, the plurality of first destination blocks BLK21, BLK22, . . . BLK2n and the plurality of second destination blocks BLK31, BLK32, . . . BLK3n by moving the data read from the plurality of source blocks to respective destination blocks based on the segregation. For example, for each page of the source blocks BLK11, BLK12, . . . BLK1n that holds data, the frequency of BER is identified by the memory controller 110 according to determination by the ECC circuit 114. The frequency of BER indicates a read temperature value for each of the pages. The read temperature value is dependent on the number of read operations performed on the page to read the data.

For example, in the case in which a source block from among source blocks BLK11, BLK12, . . . BLK1n includes 3 pages P1, P2 and Pm wherein m=3, a user through a host (not shown) may read the first page P1 10 times, the second page P2 5 times, and the third page P3 20 times. The third page P3 has thus been read more times than the other pages P1 and P2, and thus the read temperature value for third page is greater than the other pages P1 and P2. The read temperature value is directly proportional to frequency of BER. As the read temperature value increases, the frequency of the BER increases. Based on pages having similar frequency of bit error rate, the memory controller 110 may segregate the pages having similar frequency of BER into respective groups.

For example, during a first refresh cycle of the refresh operation as shown in FIG. 3, the pages from among source blocks BLK11, BLK12 and BLK1$n$ (n=3 in this example) identified by the memory controller 110 as having frequency of BER less than a bit error rate threshold value are segregated into a group having data of low/no read frequency, and the corresponding pages are moved by the memory controller 110 to first destination block BLK2$n$ (i.e., block BLK23). The pages from among source blocks BLK11, BLK12 and BLK1$n$ identified by the memory controller 110 as having frequency of BER equal to the bit error rate threshold value are segregated into a group having data of mid read frequency, and the corresponding pages are moved by the memory controller 110 to first destination block BLK22. The pages from among source blocks BLK11, BLK12 and BLK1$n$ identified by the memory controller 110 as having frequency of BER greater than the bit error rate threshold value are segregated into a group having data of high read frequency, and the corresponding pages are moved by the memory controller 110 to first destination block BLK21.

As shown in FIG. 3, some of the pages near the bottom of the first destination blocks BLK21 and BLK22 may be empty. In embodiments of the inventive concepts, as the number of pages in a segregated group is increased, the corresponding pages of that segregated group may be moved by the memory controller 110 to more than one first destination blocks. For example, more than one of the first destination blocks BLK21, BLK22, ... BLK2$n$ may be used to store pages of a same segregated group.

During a second refresh cycle of the refresh operation following the first refresh operation, the pages in the first destination blocks BLK21, BLK22, ... BLK2$n$ are read by the memory controller 110, and the pages among the first destination blocks BLK21, BLK22, ... BLK2$n$ identified by the memory controller 110 as having frequency of BER greater than the bit error rate threshold value are segregated into a group having data of high read frequency. These corresponding pages of high read frequency are moved by the memory controller 110 to second destination block BLK31. The pages from among the first destination blocks BLK21, BLK22, ... BLK2$n$ identified by the memory controller 110 as having frequency of BER equal to the bit error rate threshold value are segregated into a group having data of mid read frequency, and these corresponding pages are moved by the memory controller 110 to second destination block BLK32.

However, as further shown in FIG. 3, in embodiments of the inventive concepts the pages from among the first destination blocks BLK21, BLK22, ... BLK2$n$ identified by the memory controller 110 as having frequency of BER less than the bit error rate threshold value are grouped as data of low/no read frequency, and the corresponding pages are not moved by the memory controller 110 to any of the second destination blocks BLK31, BLK32, ... BLK3$n$. In this case, because refresh is not needed and the corresponding pages from among the first destination blocks BLK21, BLK22, ... BLK2$n$ grouped as having low/no read frequency are not moved, unnecessary use of system resources and processing time may be avoided.

Figure 4:
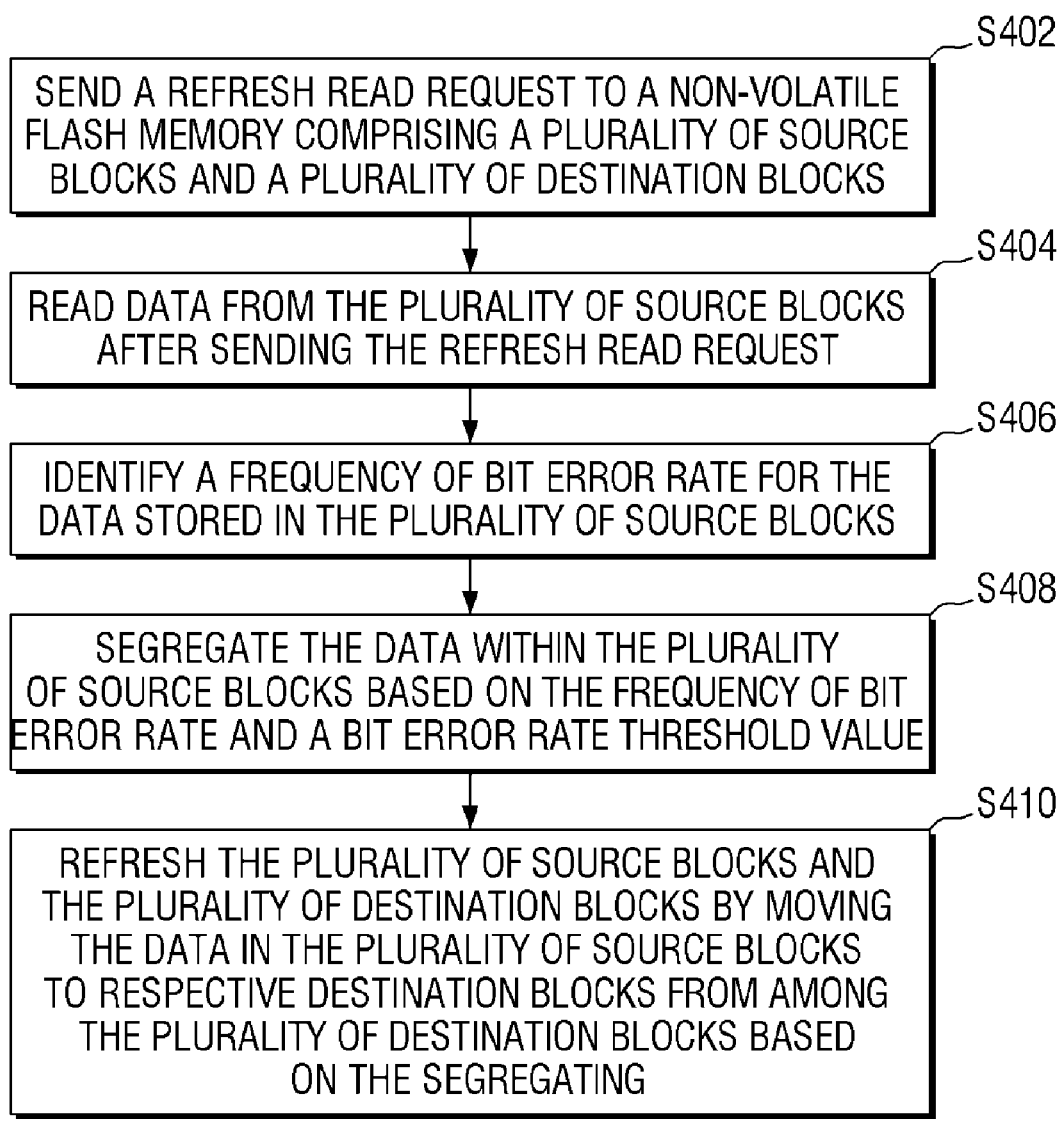
FIG. 4 illustrates a flowchart descriptive of a method of organizing data during a refresh operation according to embodiments of the inventive concepts.

FIG. 4 illustrates a flowchart descriptive of a method of organizing data during a refresh operation according to embodiments of the inventive concepts. The following description will be taken with reference to FIGS. 1, 3 and 4, wherein the data within the memory cell array 124 of non-volatile memory 120 is organized during a refresh operation.

In embodiments of the inventive concepts, the memory device 100 may be an embedded multi-media card (eMMC®), a Security Digital™ card (SD) or a microSD® card, for example. Moreover, it should be understood that the order in which the method of organizing as described with respect to the flowchart of FIG. 4 is not intended to be construed as limiting, and any number of the described blocks may be combined in any order as appropriate to implement the method of organizing data during a refresh operation. Additionally, individual blocks may be deleted as appropriate without departing from the spirit and scope of the inventive concepts. Also, the method of organizing data may be implemented in any suitable hardware, software, firmware, or combination thereof.

At S402 of FIG. 4, the memory controller 110 of the memory device 100 sends the refresh read request to non-volatile memory 120 including memory cell array 124 having a plurality of source blocks BLK11, BLK12, ... BLK1$n$, a plurality of first destination blocks BLK21, BLK22, ... BLK2$n$, and a plurality of second destination blocks BLK31, BLK32, ... BLK3$n$. The memory controller 110 sends the refresh read request to non-volatile memory 120 via bi-directional line 130.

At S404 of FIG. 4, the memory controller 110 reads data from the plurality of source blocks BLK11, BLK12, ... BLK1$n$ upon (e.g., after) sending the refresh read request. In some embodiments, the data read operation is performed on logical blocks such as super blocks, pages and/or wordlines, or at a physical level. For example, the memory controller 110 may read the data from the plurality of pages of the plurality of source blocks. In various embodiments, the read request may be differently triggered. For example, an external request (e.g., a host system commanding the memory device 100 to perform the read operation and/or a host system commanding the memory device 100 to perform a write operation), or such as by an internal request (e.g., the memory controller 110 may determine to perform an internal read operation).

At S406 of FIG. 4, the memory controller 110 of the memory device 100 identifies a frequency of BER for the data stored in the plurality of source blocks BLK11, BLK12, ... BLK1$n$ responsive to the ECC circuit 114. For example, the memory controller 110 may identify a frequency of BER for data stored in the plurality of pages of the plurality of source blocks. The read temperature value for stored data in each of plurality of pages is identified for each of the plurality of source blocks. The identified read temperature values are compared with the bit error rate threshold value. Also, in some embodiments the errors in the read data determined (e.g., detected) by the ECC circuit 114 may be analyzed to determine whether to refresh part or all of a section of memory. In some embodiments, the number of errors may be compared to an error threshold. In response to determining that the number of errors exceeds the error threshold, a refresh operation may be performed. The error threshold against which the number of errors is compared may be static, and in other embodiments be dynamic. For example, the error threshold may be dynamically selected based on an operating condition (e.g., the temperature of the memory device) and/or based on age or use of the memory.

In response to determining to refresh the block, the refresh operation may be performed in one of several ways. In some embodiments the memory controller 110 may command a memory chip included in the non-volatile memory 120 to perform the refresh operation, and may subsequently verify whether the refresh operation has been performed properly. For example, the memory controller 110 may command the memory chip to perform the refresh operation on a section of memory (such as a block or a wordline). Thereafter, the memory controller 110 may read the section of memory, determine errors in the read data, and then determine based on the number of errors in the read data whether the refresh operation has been performed properly. In some embodiments, in response to determining that the refresh has not been successfully performed, the memory controller 110 may send another command to the memory chip to perform the refresh operation in the section of memory, optionally with a different programming voltage to be used on the memory chip during the refresh operation. Thereafter, the memory controller 110 may again read the section of memory, determine the number of errors in the read data, and determine whether the refresh operation has been properly performed. In this regard, the memory device controller may iterate through multiple refresh cycles.

In some embodiments, identification of the frequency of bit error rate (BER) comprises identifying a read temperature value for stored data in each of plurality of pages associated with each of the plurality of source blocks. Further, comparing the identified read temperature values with the BER threshold value and identifying the frequency of BER for the data stored in each of the plurality of pages based on the comparison.

At S408 in FIG. 4, the memory controller 110 segregates the data within the plurality of source blocks based on the frequency of the BER and the BER threshold value. For example, the memory controller 110 may segregate the plurality of pages of the source blocks into groups based on the frequency of the BER and the BER threshold value. The data related to each of plurality of pages having similar frequency of BER is identified. Each of the pages holding data having similar frequency of bit error rate are grouped.

In some embodiments the memory controller 110 may command a memory chip included in the non-volatile memory 120 to perform one or many read operations, and the read data passed through the ECC circuit 114 to correct errors. After errors are corrected, the ECC circuit 114, reports the number for BITS corrected, which is termed as frequency of BER. This BER is used to identify the temperature of the read data. For example, 0-50 may be considered as low temperature data, data having a frequency of BER in a BER threshold range of 50-100 may be considered as medium temperature data, and data having a frequency of BER in a BER threshold range of above 100 may be considered as high temperature data.

In some embodiments one or more BER threshold values may be defined. Each BER threshold may be used to categorize the read hotness of the data. In some embodiments, the BER threshold values may be ranges. For example, data having a frequency of BER in a BER threshold range of 0-50 may be considered as low temperature data, data having a frequency of BER in a BER threshold range of 50-100 may be considered as medium temperature data, and data having a frequency of BER in a BER threshold range of above 100 may be considered as high temperature data. Based on the one or more BER threshold values/ranges and the determined frequency of BER, the data in the plurality of source blocks may be segregated. An example segregation is shown in and described with respect to FIG. 3. In some embodiments, the frequency of bit error rate (BER) may be categorized as at least one of a very high frequency, a high frequency, a medium frequency, a low frequency, and a very low frequency. In some embodiments, to generalize the step of segregation, the method may include identifying data related to each of plurality of pages having similar frequency of bit error rate; grouping each of the pages storing data having similar frequency of bit error rate; and segregating the data within the plurality of source blocks based on the grouping. In some embodiments, each destination block from the plurality of destination blocks is addressed sequentially.

At S410 of FIG. 4, the memory controller 110 of the memory device 100 refreshes the plurality of source blocks and the plurality of destination blocks by moving the data present in the plurality of source blocks to respective destination blocks from the plurality of source blocks based on the segregation. For example, the memory controller 110 moves data from pages of source blocks and destination blocks that have been segregated into groups to respective destination blocks. The memory controller 110 may move the data stored in the first destination blocks to second destination blocks based on segregation. Each destination block from the plurality of destination blocks is addressed sequentially.

In embodiments of the inventive concepts, redundant movement of cold data during refresh cycles may be reduced. Also, the amount of time needed to refresh the memory device 100 may be reduced. As a result, the life of the memory device 100 may be increased. Additionally, embodiments of the inventive concepts reduce complexity of tracking hot/warm/cold data accesses.

Figure 5:
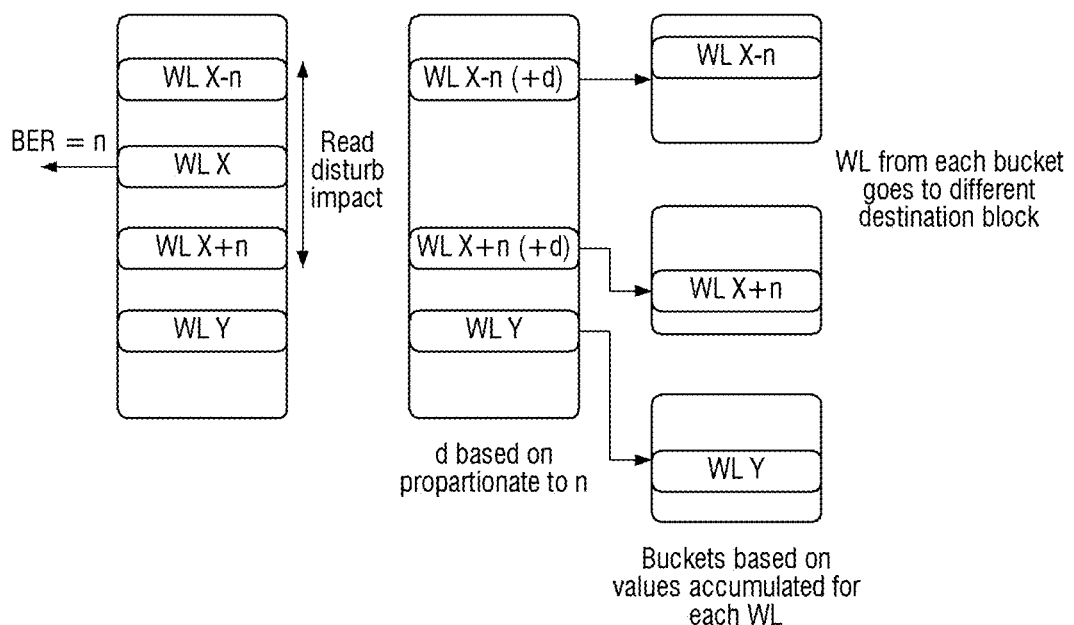
FIG. 5 illustrates events occurring in order according to embodiments of the inventive concepts.

FIG. 5 illustrates events occurring in order according to embodiments of the inventive concepts. In alternative embodiments, certain operations may be performed in a different order, modified, or removed. In other embodiments, steps may be added. Still further, operations described herein may occur (i.e., be performed) sequentially or certain operations may be processed in parallel. Also, operations may be performed by a single processing unit or by distributed processing units.

While various aspects and embodiments have been disclosed herein, other aspects and embodiments may be apparent to those skilled in the art. The various aspects and embodiments disclosed herein are for purposes of illustration and are not intended to be limiting.

What is claimed:

1. A method of organizing data during a refresh cycle of a memory device, the method comprising:
   sending, by a memory controller, a refresh read request to a non-volatile flash memory comprising a plurality of source blocks and a plurality of destination blocks;
   reading, by the memory controller, data from the plurality of source blocks after sending the refresh read request;
   identifying, by the memory controller, a frequency of bit error rate for the data stored in the plurality of source blocks;
   segregating, by the memory controller, the data within the plurality of source blocks based on the frequency of bit error rate and a bit error rate threshold value; and
   refreshing, by the memory controller, the plurality of source blocks and the plurality of destination blocks by moving the data in the plurality of source blocks to respective destination blocks from among the plurality of destination blocks based on the segregating.

2. The method of organizing data of claim 1, wherein the frequency of bit error rate comprises at least one of a very high frequency, a high frequency, a medium frequency, a low frequency, and a very low frequency.

3. The method of organizing data of claim 1, wherein the identification of the frequency of bit error rate comprises:
identifying, by the memory controller, a read temperature value for stored data in each of a plurality of pages of each of the plurality of source blocks;
comparing, by the memory controller, the identified read temperature values with the bit error rate threshold value; and
identifying, by the memory controller, the frequency of bit error rate for the data stored in each of the plurality of pages of each of the plurality of source blocks based on the comparing.

4. The method of organizing data of claim 1, wherein the segregating of the data within the plurality of source blocks comprises:
identifying, by the memory controller, data related to each of a plurality of pages of each of the plurality of source blocks having similar frequency of bit error rate;
grouping, by the memory controller, each of the plurality of pages of each of the plurality of source blocks holding data having the similar frequency of bit error rate; and
segregating, by the memory controller, the data within the plurality of source blocks based on the grouping.

5. The method of organizing data of claim 1, wherein each destination block from among the plurality of destination blocks is addressed sequentially.

6. A memory controller comprising:
a memory storing coding; and
a processor configured responsive to the coding to
send a refresh read request to a non-volatile flash memory comprising a plurality of source blocks and a plurality of destination blocks,
read data from the plurality of source blocks after sending the refresh read request, identify a frequency of bit error rate for the data stored in the plurality of source blocks,
segregate the data within the plurality of source blocks based on the frequency of bit error rate and a bit error rate threshold value, and
refresh the plurality of source blocks and the plurality of destination blocks by moving the data in the plurality of source blocks to respective destination blocks from among the plurality of destination blocks based on the data segregated within the plurality of source blocks.

7. The memory controller of claim 6, wherein the frequency of bit error rate comprises at least one of a very high frequency, a high frequency, a medium frequency, a low frequency, and a very low frequency.

8. The memory controller of claim 6, wherein to identify the frequency of bit error rate, the processor is configured to
identify a read temperature value for stored data in each of a plurality of pages of each of the plurality of source blocks,
compare the identified read temperature values with the bit error rate threshold value, and identify the frequency of bit error rate for the data stored in each of the plurality of pages of each of the plurality of source blocks based on the comparison.

9. The memory controller of claim 6, wherein to segregate the data within the plurality of source blocks, the processor is configured to
identify data related to each of a plurality of pages of each of the plurality of source blocks having similar frequency of bit error rate,
group each of the pages of each of the plurality of source blocks holding data having the similar frequency of bit error rate, and segregate the data within the plurality of source blocks based on the grouping.

10. The memory controller of claim 6, wherein the processor is configured to address each destination block from among the plurality of destination blocks sequentially.

11. A memory device comprising:
a memory including a plurality of source blocks and a plurality of destination blocks, wherein each of the plurality of source blocks store a mix of data having a plurality of read frequencies that are different; and
a memory controller that provides commands to the memory to access the data in the plurality of the source blocks and data in the plurality of destination blocks,
wherein responsive to the commands provided from the memory controller during a first refresh cycle of a refresh operation, the memory moves data from among the data stored in the plurality of source blocks and having a first read frequency from among the plurality of read frequencies to a first destination block from among the plurality of destination blocks so that only the data having the first read frequency is stored in the first destination block, and moves
data from among the data stored in the plurality of source blocks and having a second read
frequency from among the plurality of read frequencies to a second destination block from among the plurality of destination blocks so that only the data having the second read frequency is stored in the second destination block.

12. The memory device of claim 11, wherein further responsive to the commands provided from the memory controller during the first refresh cycle of the refresh operation, the memory moves data from among the data stored in the plurality of source blocks and having a third read frequency from among the plurality of read frequencies to a third destination block from among the plurality of destination blocks so that only the data having the third read frequency is stored in the third destination block.

13. The memory device of claim 12, wherein the memory controller is configured to send a refresh read request as a command from among the commands to the memory to
initiate the refresh operation,
read the data in the plurality of source blocks after sending the refresh read request, identify a frequency of bit error rate for the data count stored in the plurality of source blocks,
segregate the data within the plurality of source blocks based on the frequency of the bit error rate and a bit error rate threshold value, and
refresh the plurality of source blocks by sending the commands to move the data having the first read frequency, the second read frequency and the third read frequency respectively to the first, second and third destination blocks.

14. The memory device of claim 13, wherein the bit error rate threshold value comprises
first, second and third bit error rate threshold values.

15. The memory device of claim 13, wherein the bit error rate threshold value comprises a first range of bit error rates, a second range of bit error rates, and a third range of bit error rates.

16. The memory device of claim 12, wherein the first read frequency is a high read frequency, the second read frequency is a mid read frequency less than the high read frequency, and the third read frequency is a low read frequency less than the mid read frequency.

17. The memory device of claim 16, wherein further responsive to the commands provided from the memory controller during a second refresh cycle of the refresh operation following the first refresh cycle, the memory moves the data having the first read frequency from the first destination block to a fourth destination block from among the plurality of destination blocks so that only the data having the first read frequency is stored in the fourth destination
> block, moves the data having the second read frequency from the second destination block to a fifth destination block from among the plurality of destination blocks so that only the data having the second read frequency is stored in the fifth destination block, and maintains the data having the third read frequency in the third destination block without movement to a further destination block from among the plurality of destination blocks.

18. The memory device of claim 11, wherein further responsive to the commands provided from the memory controller during a second refresh cycle of the refresh operation following the first refresh cycle, the memory moves the data having the first read frequency from the first destination block to a third destination block from among the plurality of destination
> blocks so that only the data having the first read frequency is stored in the third destination
> block, and moves the data having the second read frequency from the second destination block to a fourth destination block from among the plurality of destination blocks so that only the data having the second read frequency is stored in the fourth destination block.

19. The memory device of claim 11, wherein further responsive to the commands provided from the memory controller during a second refresh cycle of the refresh operation following the first refresh cycle, the memory moves the data having the first read frequency from the first destination block to a third destination block from among the plurality of destination blocks so that only the data having the first read frequency is stored in the third destination
> block, and maintains the data having the second read frequency in the second destination block without movement to a further destination block from among the plurality of destination blocks.

20. The memory device of claim 11, wherein the memory comprises non- volatile flash memory.

* * * * *